(12) United States Patent
Howder et al.

(10) Patent No.: US 12,419,048 B2
(45) Date of Patent: Sep. 16, 2025

(54) MEMORY CIRCUITRY AND METHOD USED IN FORMING MEMORY CIRCUITRY

(71) Applicant: Micron Technology, Inc., Boise, ID (US)

(72) Inventors: Collin Howder, Boise, ID (US); Taehyun Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 558 days.

(21) Appl. No.: 17/751,978

(22) Filed: May 24, 2022

(65) Prior Publication Data
US 2023/0389312 A1    Nov. 30, 2023

(51) Int. Cl.
*H10B 43/27*     (2023.01)
*H10B 41/27*     (2023.01)

(52) U.S. Cl.
CPC ............ *H10B 43/27* (2023.02); *H10B 41/27* (2023.02)

(58) Field of Classification Search
CPC ......... H10B 43/27; H10B 41/27; H10B 43/10
See application file for complete search history.

(56) References Cited

U.S. PATENT DOCUMENTS 10,658,377 B2 *   5/2020   Kubo ............... H10B 43/27
2020/0091186 A1 * 3/2020   Yang ............... H10B 41/27

* cited by examiner

*Primary Examiner* — Britt D Hanley
*Assistant Examiner* — William C. Trice, III
(74) *Attorney, Agent, or Firm* — Wells St. John P.S.

(57) ABSTRACT

A method used in forming a memory array comprising strings of memory cells comprises forming a stack comprising vertically-alternating different-composition first tiers and second tiers. The stack comprises lower channel-material strings extending through the first tiers and the second tiers. A sacrificial plug comprises sacrificial material directly above individual of the lower channel-material strings. The sacrificial material is removed from laterally-opposing corner regions of the sacrificial plug in a greater amount diagonally than orthogonally relative to a sidewall of individual of the corner regions and than orthogonally relative to a top of the individual corner regions. Insulator material is formed in void spaces left from the removing. After forming the insulator material, remaining volume of the sacrificial plug is removed. Channel material of upper channel-material strings is formed below and against lower surfaces of the insulator material and that directly couples to channel material of the lower channel-material strings. Other embodiments, including structure, are disclosed.

17 Claims, 19 Drawing Sheets

FIG. 10 { V→ D→ H→ }

MEMORY CIRCUITRY AND METHOD USED IN FORMING MEMORY CIRCUITRY

TECHNICAL FIELD

Embodiments disclosed herein pertain to memory circuitry and to methods used in forming memory circuitry.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

BRIEF DESCRIPTION OF THE DRAWINGS

FIGS. 5-35 are diagrammatic sequential sectional and/or enlarged views of the construction of FIGS. 1-6, or portions thereof or alternate and/or additional embodiments, in process in accordance with some embodiments of the invention.

DETAILED DESCRIPTION OF EXAMPLE EMBODIMENTS

Figure 1:
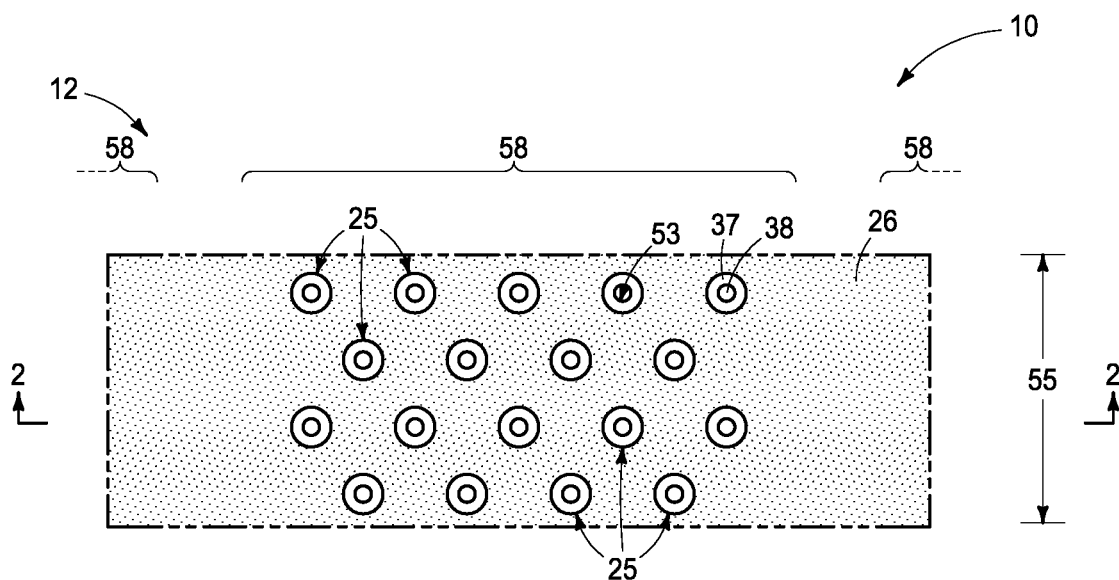
FIGS. 1-6 are diagrammatic cross-sectional views of portions of a construction that will comprise an array of elevationally-extending strings of memory cells in accordance with an embodiment of the invention.
Figure 2:
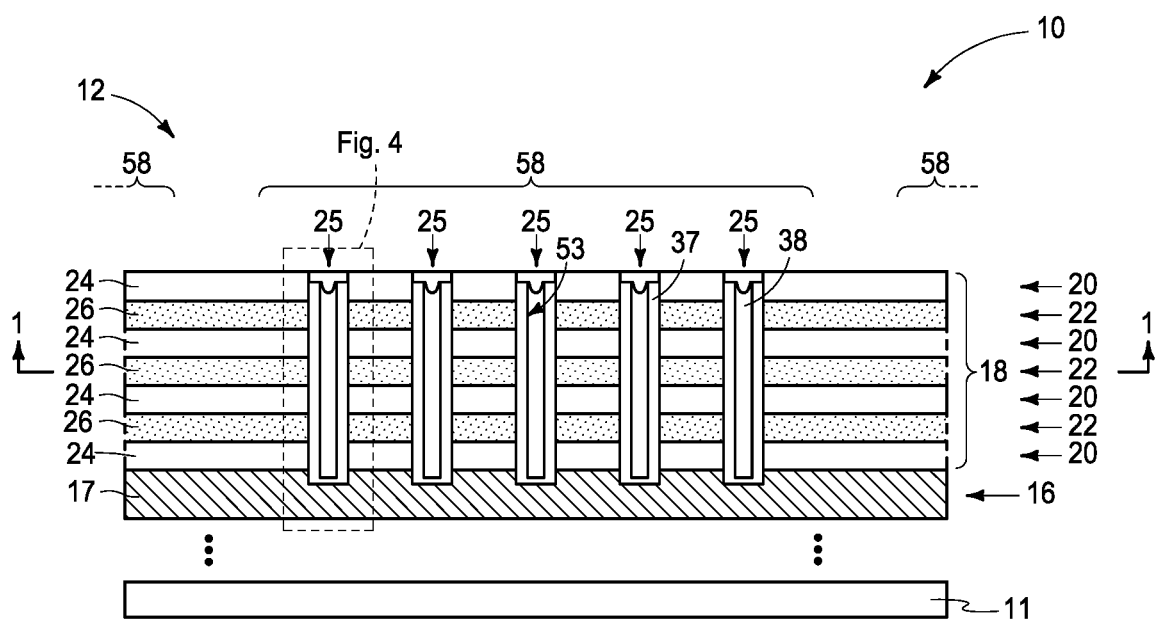
Figure 3:
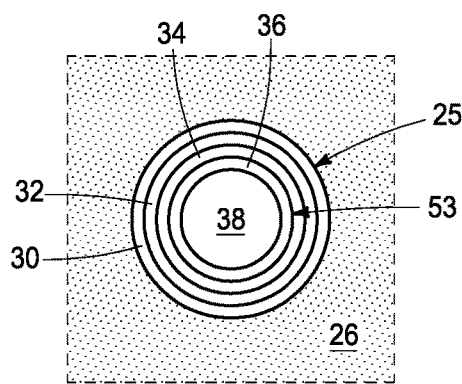
Figure 4:
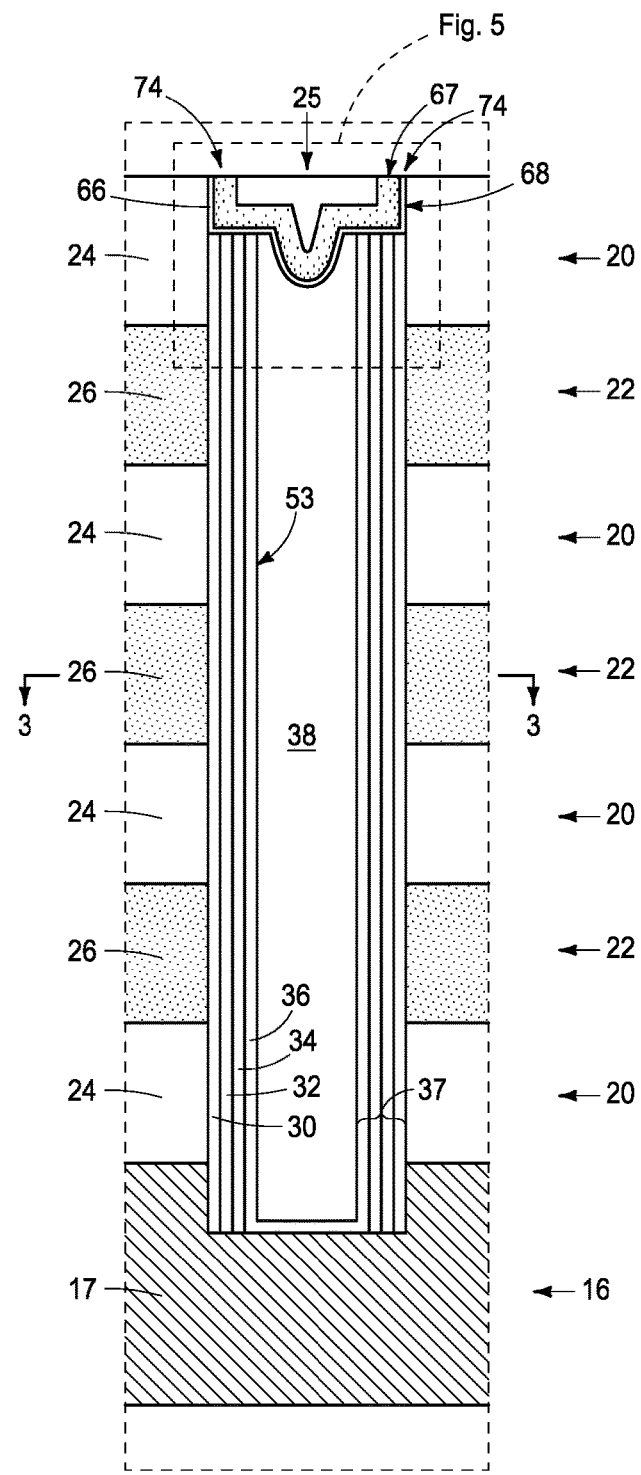
Figure 5:
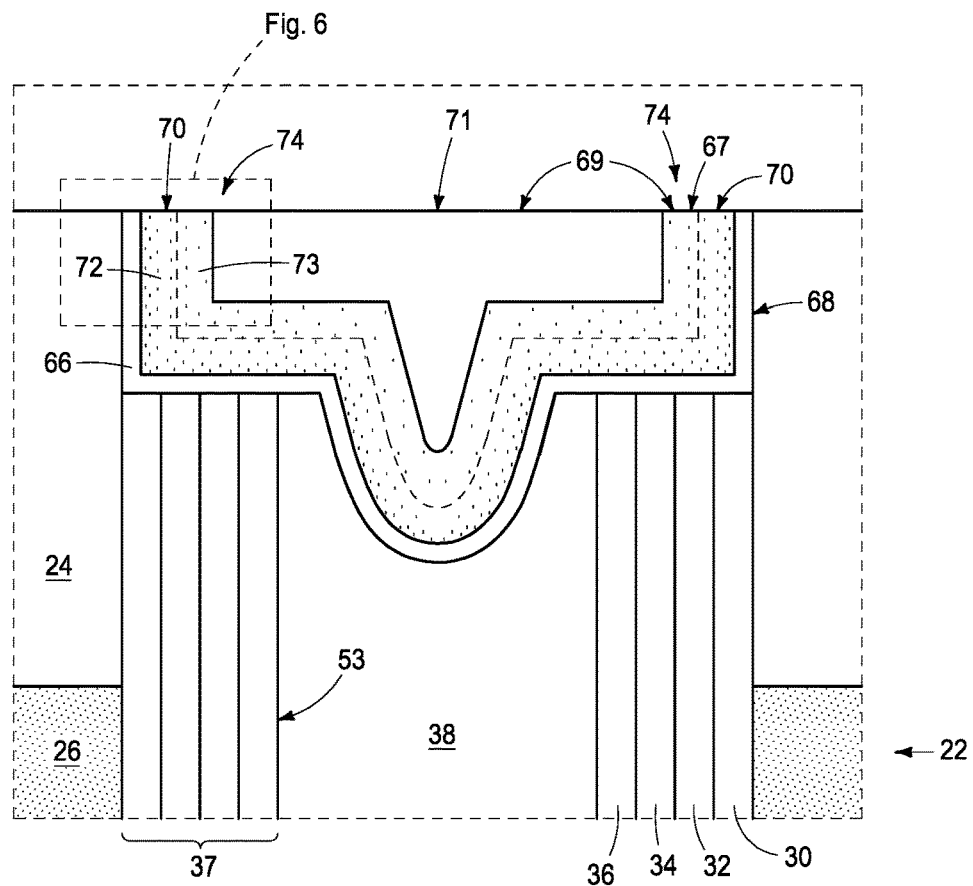
Figure 6:
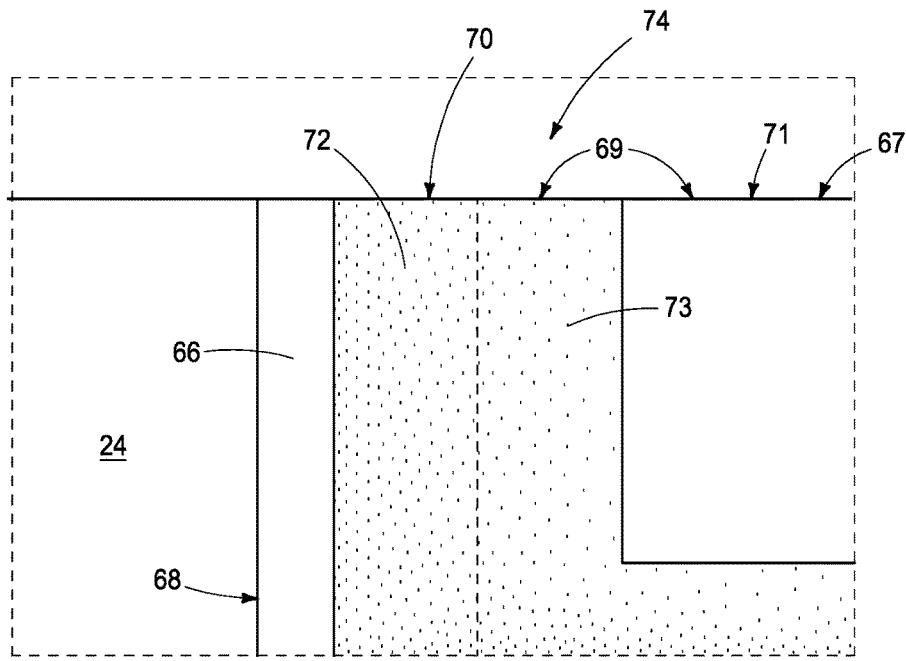
Figure 7:
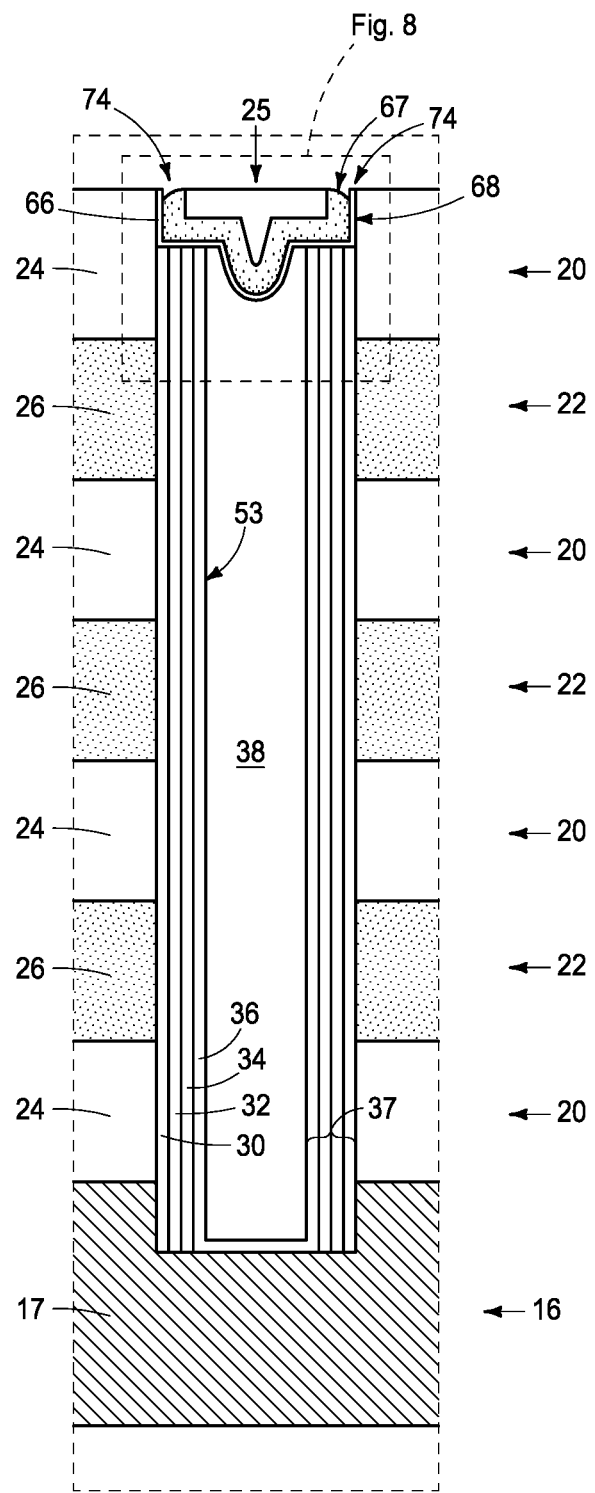
Figure 8:
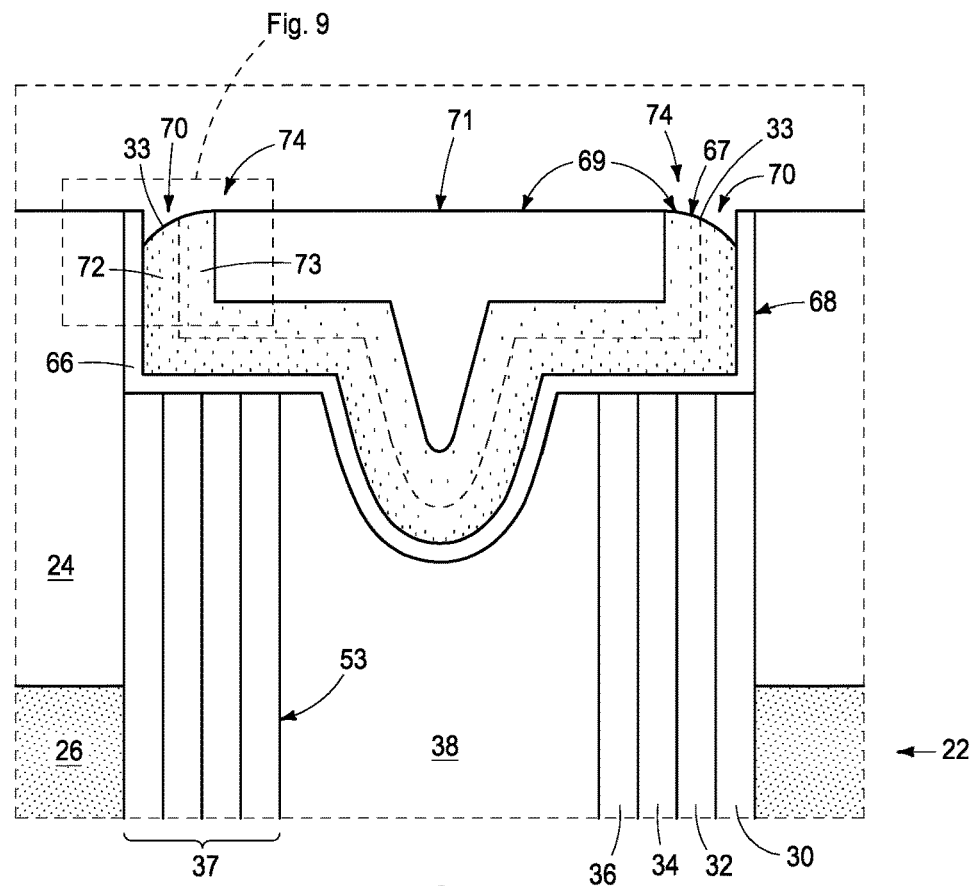
Figure 9:
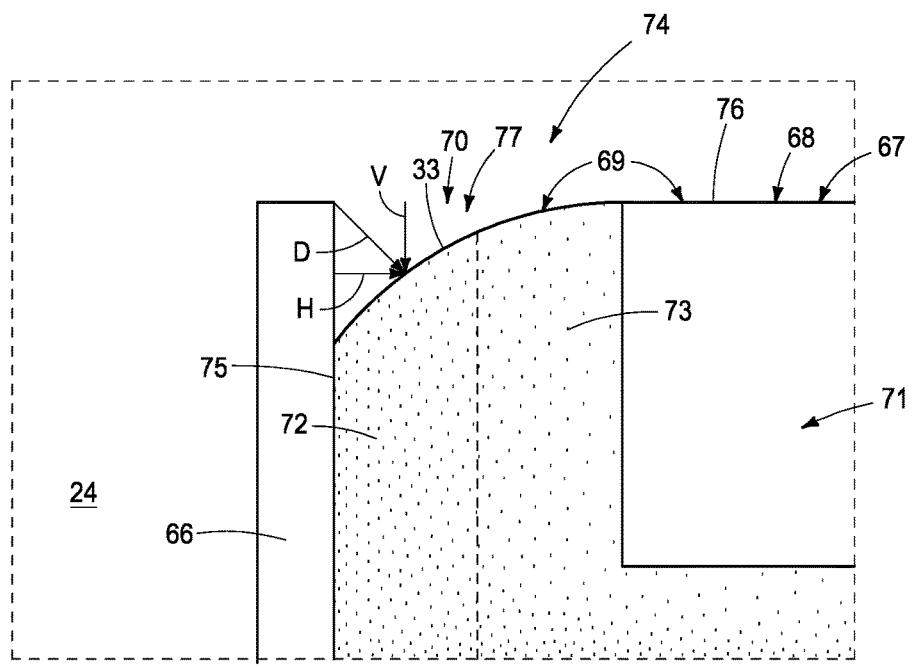

Embodiments of the invention encompass methods used in forming a memory array, for example an array of NAND or other memory cells that may have at least some peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass integrated circuitry comprising a memory array comprising strings of memory cells (e.g., NAND architecture) independent of method of manufacture. First example method embodiments are described with reference to FIGS. 1-35.

FIGS. 1-6 show an example construction 10 having an array 12 in which elevationally-extending strings of transistors and/or memory cells will be formed. Such includes a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1-6-depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductor material 17 (e.g., WSi$_x$ under conductively-doped polysilicon) is above substrate 11. Conductor tier 16 may comprise part of control circuitry (e.g., peripheral-under-array circuitry and/or a common source line or plate) used to control read and write access to the transistors and/or memory cells in array 12. A stack 18 comprising vertically-alternating insulative tiers 20 and conductive tiers 22 is directly above conductor tier 16. In some embodiments, conductive tiers 22 may be referred to as first tiers 22 and insulative tiers 20 may be referred to as second tiers 20. First tiers 22 may be conductive and second tiers 20 may be insulative, yet need not be so at this point of processing in conjunction with the hereby initially-described example method embodiment which is "gate-last" or "replacement-gate". Example thickness for each of tiers 20 and 22 is 20 to 60 nanometers. The example uppermost tier 20 may be thicker/thickest compared to one or more other tiers 20 and/or 22. Example first tiers 22 comprise material 26 (e.g., silicon nitride) and example second tiers 20 comprise material 24 (e.g., silicon dioxide). Only a small number of tiers 20 and 22 is shown in FIGS. 1-4, with more likely stack 18 comprising dozens, a hundred or more, etc. of tiers 20 and 22. Other circuitry that may or may not be part of peripheral and/or control circuitry may be between conductor tier 16 and stack 18. For example, multiple vertically-alternating tiers of conductive material and insulative material of such circuitry may be below a lowest of the conductive tiers 22 and/or above an uppermost of the conductive tiers 22. For example, one or more select gate tiers (not shown) may be between conductor tier 16 and the lowest conductive tier 22. Alternately or additionally, at least one of the depicted lowest conductive tiers 22 may be a select gate tier.

Channel openings 25 have been formed (e.g., by etching) through insulative tiers 20 and conductive tiers 22 to conductor tier 16. Channel openings 25 may taper radially-inward and/or radially-outward (not shown) moving deeper in stack 18. In some embodiments, channel openings 25 may go into conductor material 17 of conductor tier 16 as shown or may stop there-atop (not shown). Alternately, as an example, channel openings 25 may stop atop or within the lowest insulative tier 20. A reason for extending channel openings 25 at least to conductor material 17 of conductor tier 16 is to assure direct electrical coupling of channel material to conductor tier 16 without using alternative processing and structure to do so when such a connection is desired and/or to provide an anchoring effect to material that is within channel openings 25. Etch-stop material (not shown) may be within or atop conductor material 17 of conductor tier 16 to facilitate stopping of the etching of channel openings 25 relative to conductor tier 16 when such is desired. Such etch-stop material may be sacrificial or non-sacrificial. By way of example and for brevity only, channel openings 25 are shown as being arranged in groups or columns of staggered rows of four and five openings 25 per row and being arrayed in laterally-spaced memory-block regions 58 that will comprise laterally-spaced memory blocks 58 in a finished circuitry construction. In this document, "block" is generic to include "sub-block". Memory-block regions 58 and resultant memory blocks 58 (not yet shown) may be considered as being longitudinally elongated and oriented, for example along a first direction 55. Any alternate existing or future-developed arrangement and construction may be used.

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally between the channel material and the storage material.

The figures show one embodiment wherein charge-blocking material 30, storage material 32, and charge-passage material 34 have been formed in individual channel openings 25 elevationally along insulative tiers 20 and conductive tiers 22. Transistor materials 30, 32, and 34 (e.g., memory-cell materials) may be formed by, for example, deposition of respective thin layers thereof over stack 18 and within individual channel openings 25 followed by planarizing such back at least to a top surface of stack 18 as shown.

Channel material 36 has also been formed in channel openings 25 elevationally along insulative tiers 20 and conductive tiers 22 and comprise individual lower channel-material strings 53 in one embodiment having memory-cell materials (e.g., 30, 32, and 34) there-along and with material 24 in insulative tiers 20 being horizontally-between immediately-adjacent lower channel-material strings 53. Materials 30, 32, 34, and 36 are collectively shown as and only designated as material 37 in some figures due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted as shown to remove materials 30, 32, and 34 from the bases of channel openings 25 to expose conductor tier 16 such that channel material 36 (lower channel-material string 53) is directly electrically coupled with conductor material 17 of conductor tier 16. Such punch etching may occur separately with respect to each of materials 30, 32, and 34 (as shown) or may occur collectively with respect to all after deposition of material 34 (not shown). Alternately, and by way of example only, no punch etching may be conducted and channel material 36 may be directly electrically coupled with conductor material 17 of conductor tier 16 by a separate conductive interconnect (not shown). Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space(s) (not shown) and/or be devoid of solid material (not shown).

A sacrificial plug 67 comprising sacrificial material 68 has been formed directly above individual of lower channel-material strings 53. Sacrificial plug 67 may be considered as comprising laterally-opposing corner regions 74. Sacrificial material 68 may be any of insulating, conducting, and/or semiconductive. In some embodiments, sacrificial material 68 comprises silicon nitride 66 (or other insulating material)

and polysilicon 69 (or other doped or undoped semiconductive material), for example silicon nitride 66 that is laterally-outside of polysilicon 69 and with such polysilicon comprising a laterally-outer portion 70 and a laterally-inner portion 71, with laterally-outer portion 70 comprising a greater quantity of dopant therein (e.g., phosphorus) as compared to quantity of the dopant, if any, in laterally-inner portion 71. In one embodiment, laterally-outer portion 70 comprises a laterally-outermost part 72 and a laterally-innermost part 73 each of which comprises the dopant, with laterally-outermost part 72 comprising greater quantity of the dopant than laterally-innermost part 73. Such is intended to be diagrammatically shown in the drawings by different-density stippling across laterally-outer portion 70. By way of examples, stippling within each of parts 72 and 73 may be constant or variable, for example increasing arithmetically, geometrically, exponentially, or otherwise (regardless of whether moving in either of opposing lateral directions). As an additional consideration or embodiment, dopant density across laterally-outer portion 70 may increase arithmetically, geometrically, exponentially, or otherwise moving from laterally-inward to laterally-outward.

Referring to FIGS. 7-10, sacrificial material 68 has been removed from laterally-opposing corner regions 74 of sacrificial plug 67 in a greater amount diagonally (vector D) than orthogonally relative to a sidewall 75 of individual corner regions 74 (vector H) and than orthogonally relative to a top 76 of individual corner regions 74 (vector V), thus leaving void spaces 77 thereby. By way of example only, for brevity, and for ease-of-depiction, the removal of sacrificial material 68 from exposed corner regions 74 results in corner regions 74 having a curved/rounded surface 33 that is along a constant radius (i.e., along an arc of a circle). Alternately, by way of examples, such may result in a curved/rounded surface that is not along a constant radius (e.g., no portion thereof being along any constant radius, some portion(s) thereof being along a constant radius in combination with another/other portion(s) thereof not being along a constant radius, etc. [not shown]) where D is greater than V and H (e.g., V and H not needing to be equal relative one another). Further alternately, and by way of example, the removing of sacrificial material 68 (e.g., polysilicon 69) from corner region 74 may result in the surface corresponding to that of surface 33 to be entirely straight, have a combination of straight segments that are angled relative one another (at other than the straight angle), have a combination of straight and round/curved segments, etc. (not shown) where D is greater than V and H (which may not be equal relative one another).

In one embodiment, the removing of sacrificial material 68 from corner regions 74 comprises etching, ideally isotropic etching. The artisan is capable of selecting suitable etching chemistry or chemistries to achieve a construction as shown and described above, with particular chemistries not otherwise being pertinent. By way of example only, where laterally-outer portion 70 comprises phosphorus-doped polysilicon (e.g., to $1\times10^{14}$ to $1\times10^{23}$ phosphorus atoms/cm$^3$) and laterally-inner portion 71 comprises polysilicon that is undoped (0 to less than $1\times10^{14}$ phosphorus atoms/cm$^3$) or is lower-phosphorus doped than portion 70, tetramethylammonium hydroxide (TMAH) may be used as an isotropic etching chemistry in a short, timed etch, with the TMAH etching the higher-phosphorus-doped polysilicon faster (and in one embodiment selectively relative to silicon nitride 66, when it is present). Regardless, increasing dopant-concentration moving laterally-outward in a laterally-outer portion 70 may be ideal in producing a desired effect of greater/greatest diagonal removing of sacrificial plug 67. Alternately, by way of example, but less preferred and less ideal, such an effect may still be achieved with laterally-outer portion 70 being homogenously doped.

Figure 11:
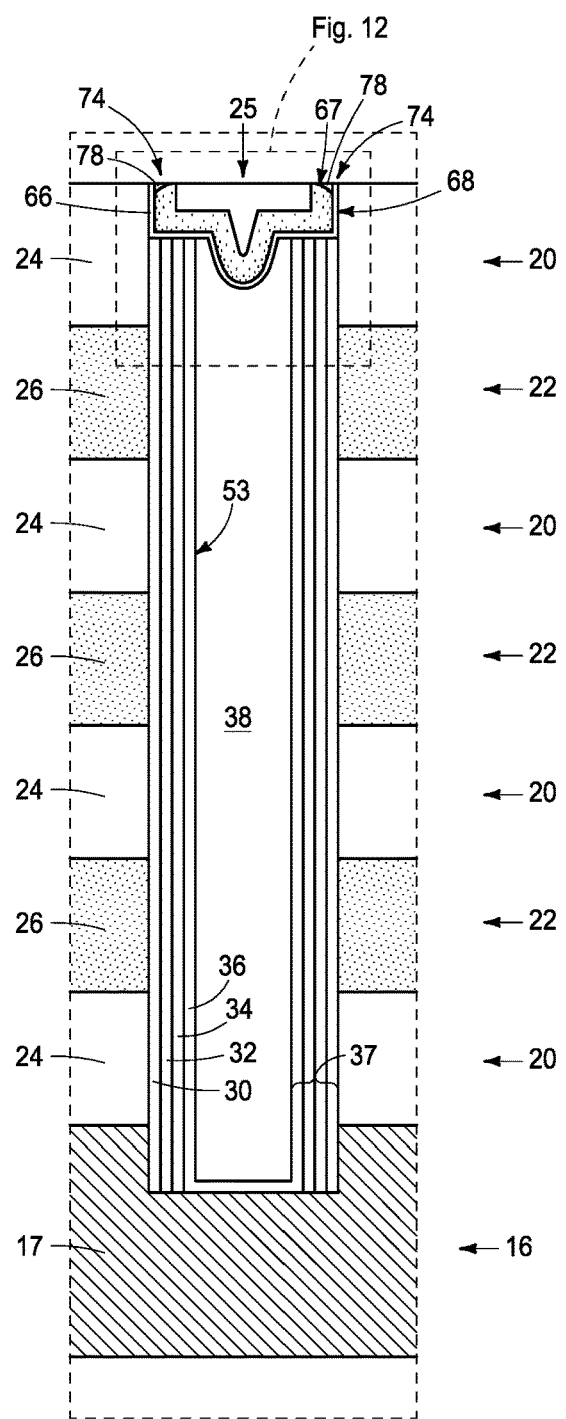
Figure 12:
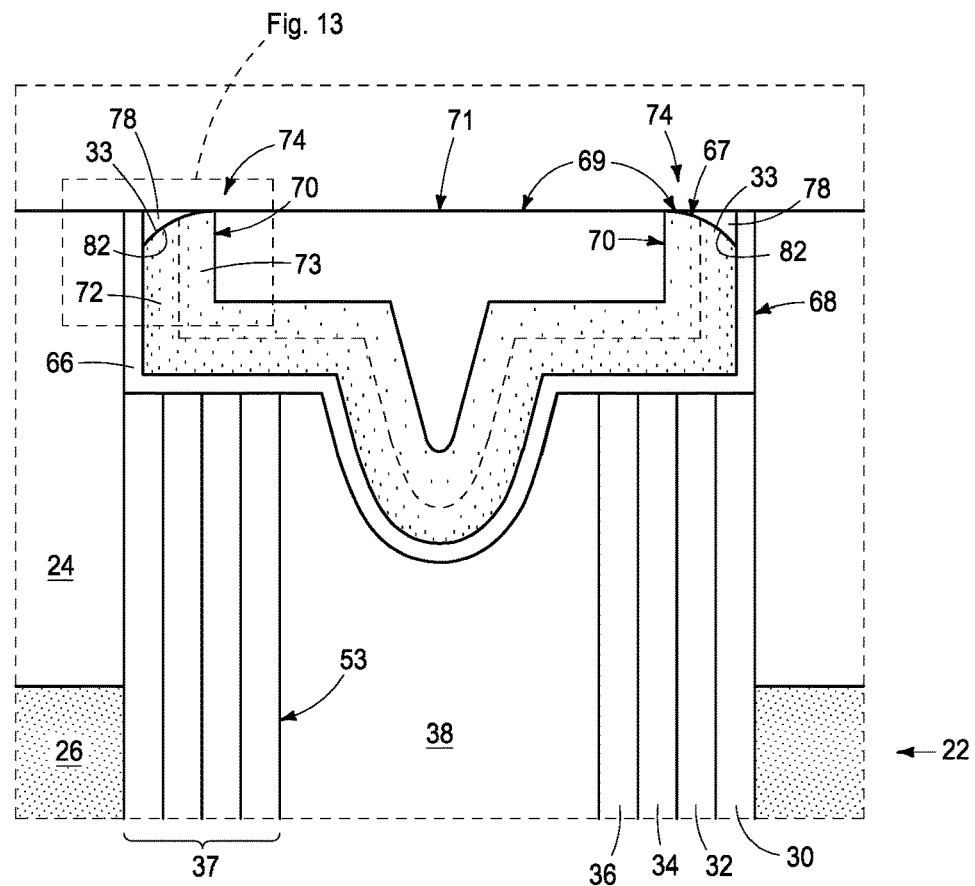
Figure 13:
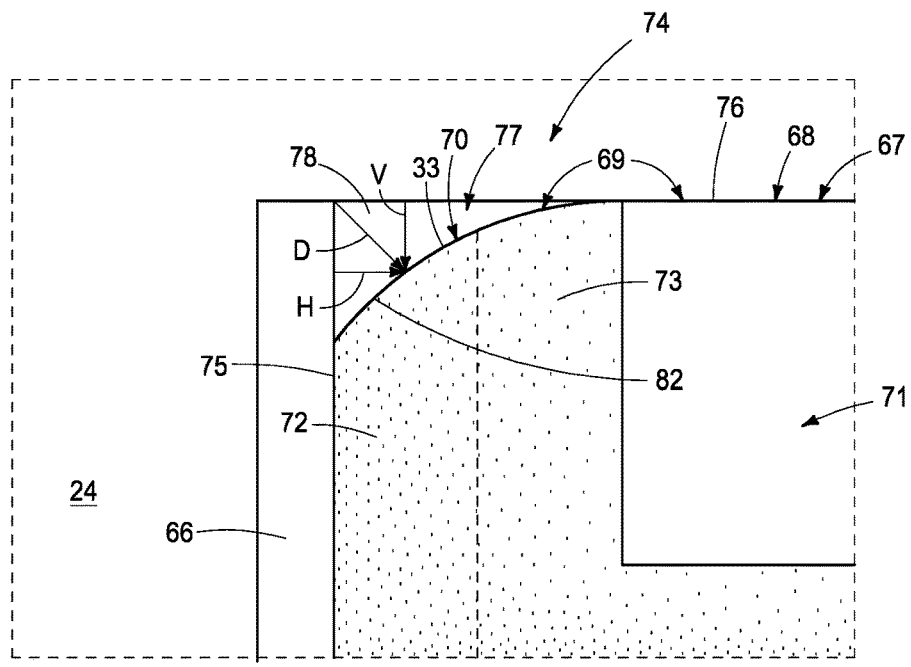

Referring to FIGS. 11-13, insulator material 78 (e.g., silicon dioxide) has been formed in void spaces 77 left from the removing of sacrificial material 68 from corner regions 74 (e.g., by deposition of insulator material 78 to overfill void spaces 77, followed by planarizing such back to the outermost surfaces of sacrificial plugs 67, silicon nitride 66 and laterally-adjacent insulative material 24). Insulator material 78 may be considered as comprising a lower surface 82 in individual corner regions 74.

Figure 14:
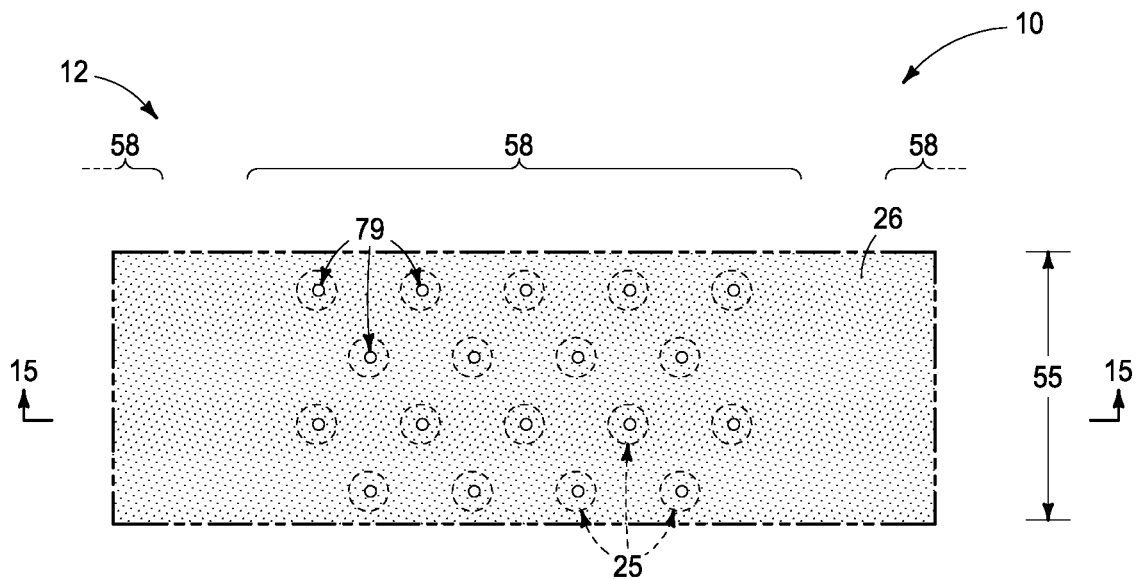
Figure 15:
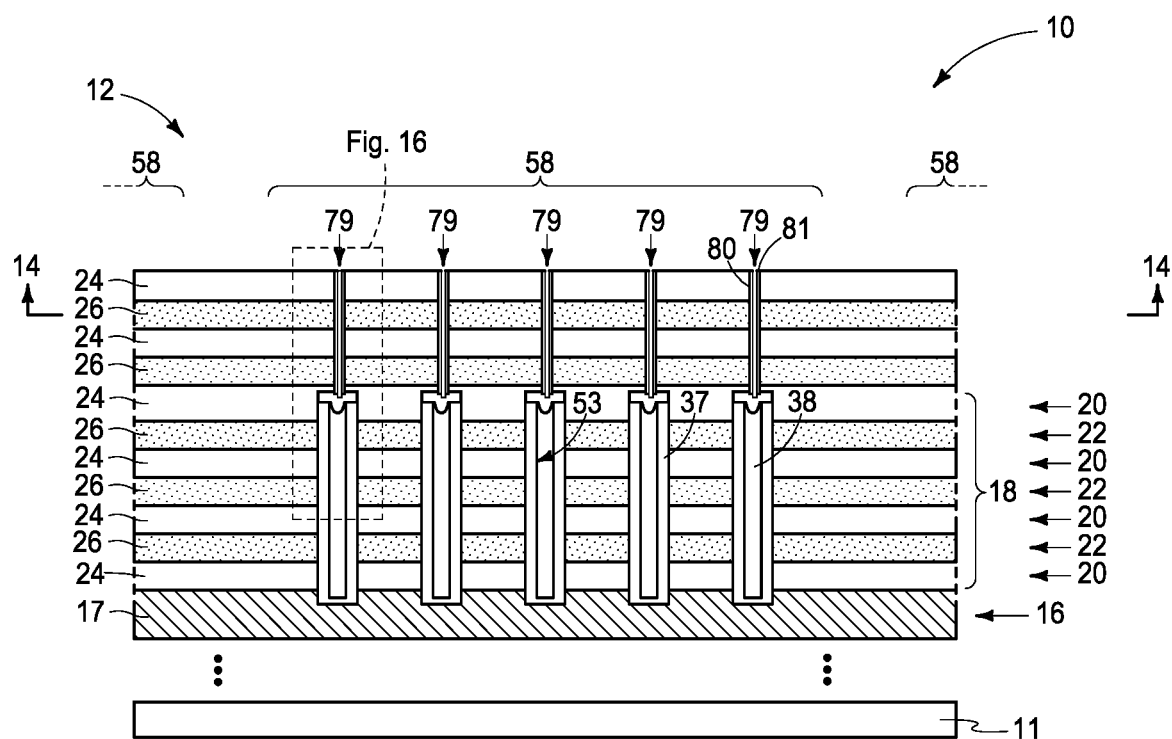
Figure 16:
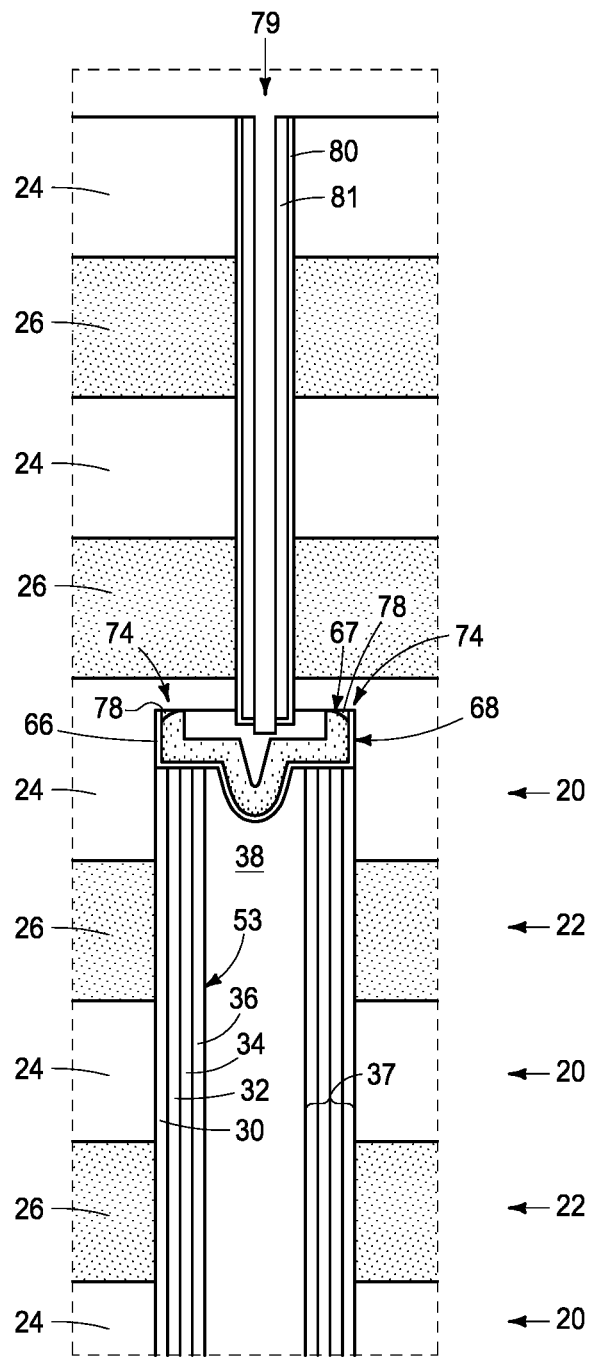

Referring to FIGS. 14-16, and in one embodiment, additional alternating first and second tiers 20 and 22 have been formed above stack 18 for fabrication of select gate transistors (e.g., select gate drains). Upper-channel openings 79 have been formed that are at least partially directly above sacrificial plugs 67, and which are ideally be smaller than channel openings 25. Individual upper-channel openings 79 may be aligned differently with respect to individual lower channel openings 25 and, regardless, may not be centered thereover. Upper-channel openings 79 have been lined with a gate insulator 80 (e.g., silicon dioxide) and sacrificial material 81 (e.g., polysilicon). Thereafter, such sacrificial material 81 and gate insulator 80 have been punch-etched to expose sacrificial material 68.

Figure 17:
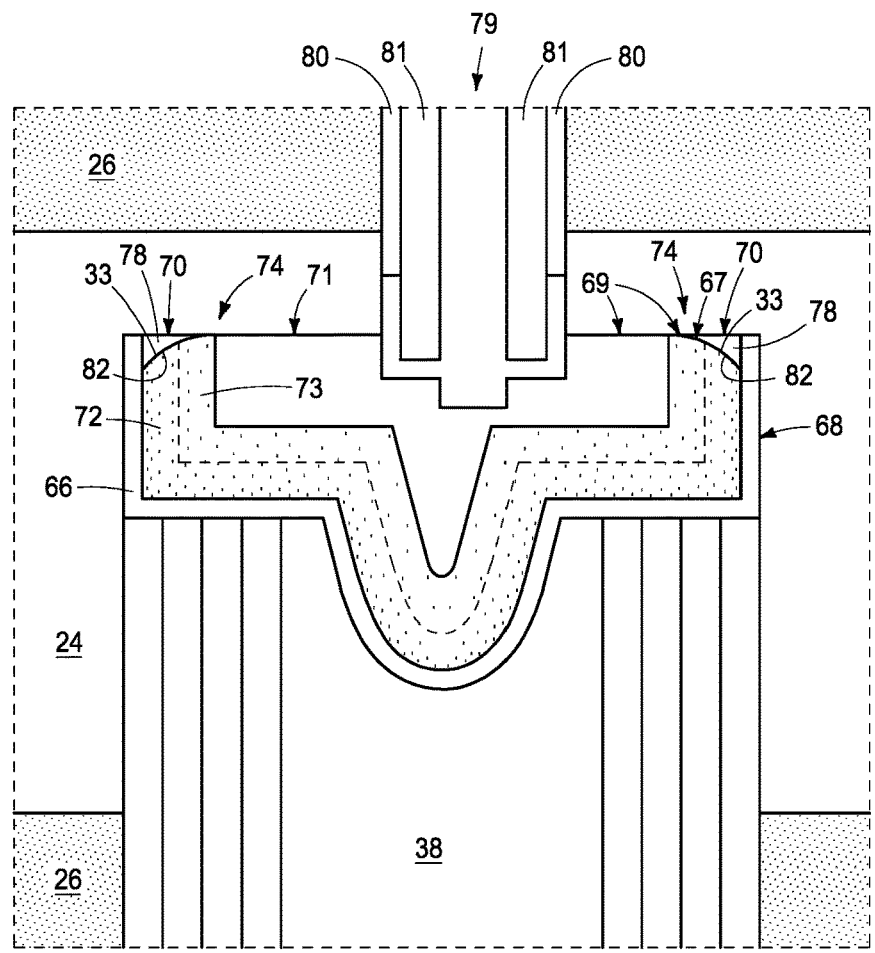
Figure 18:
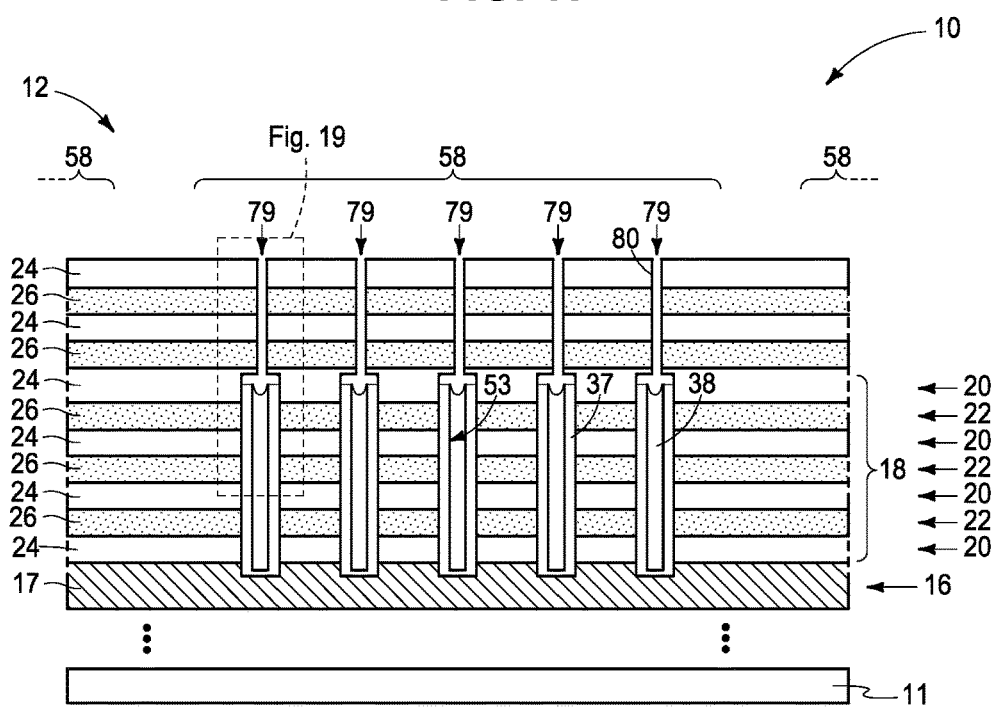
Figure 19:
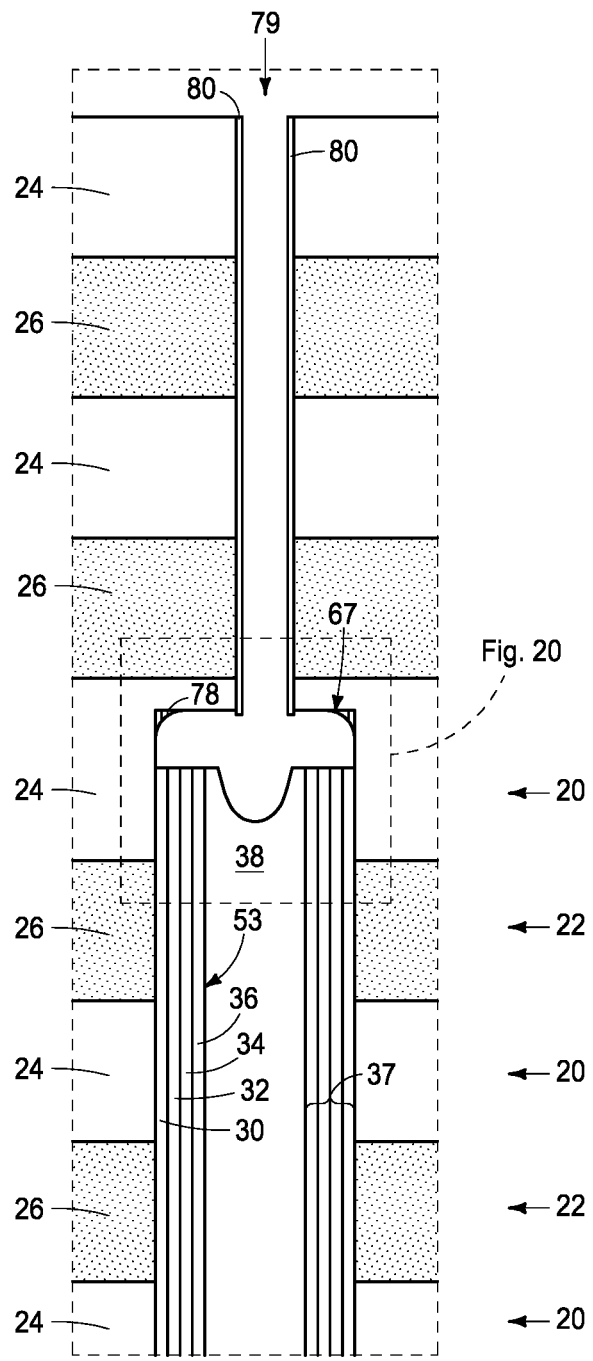
Figure 20:
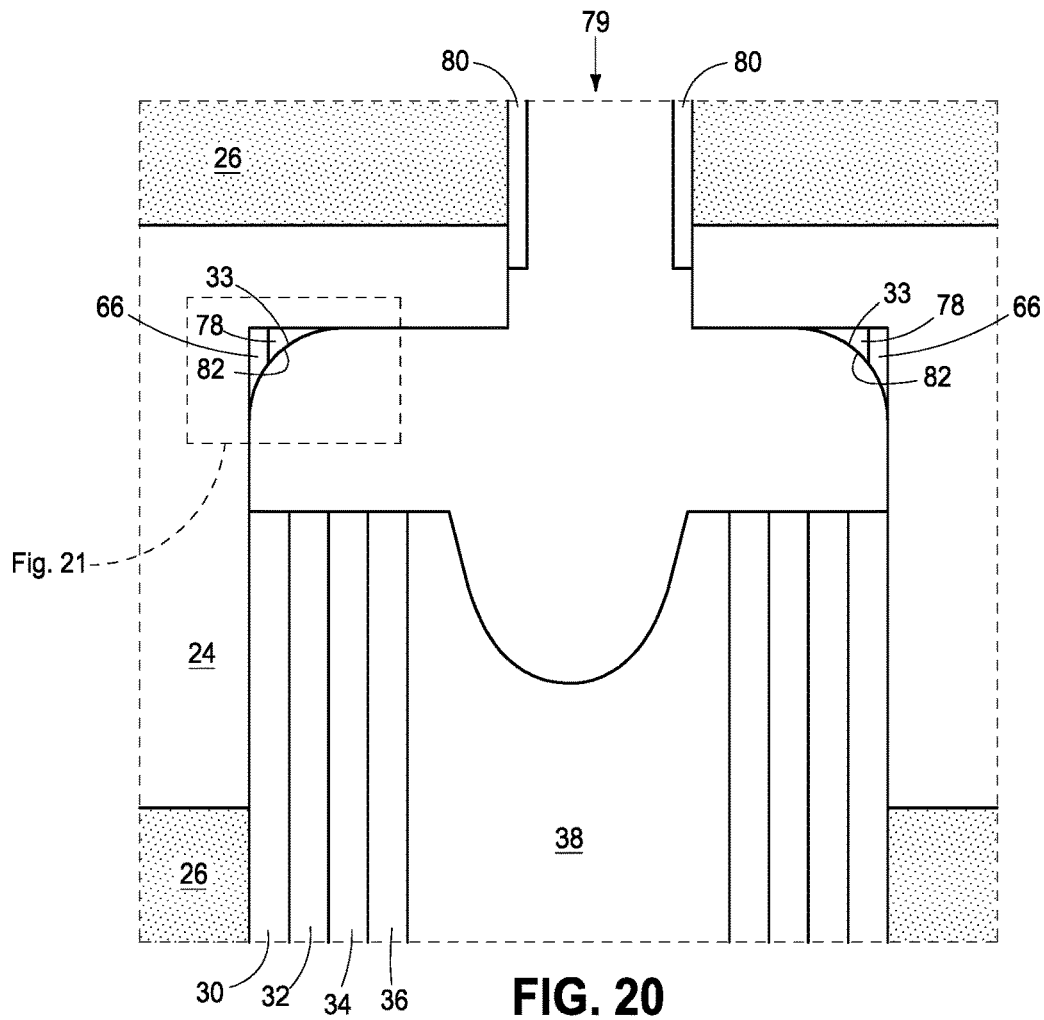
Figure 21:
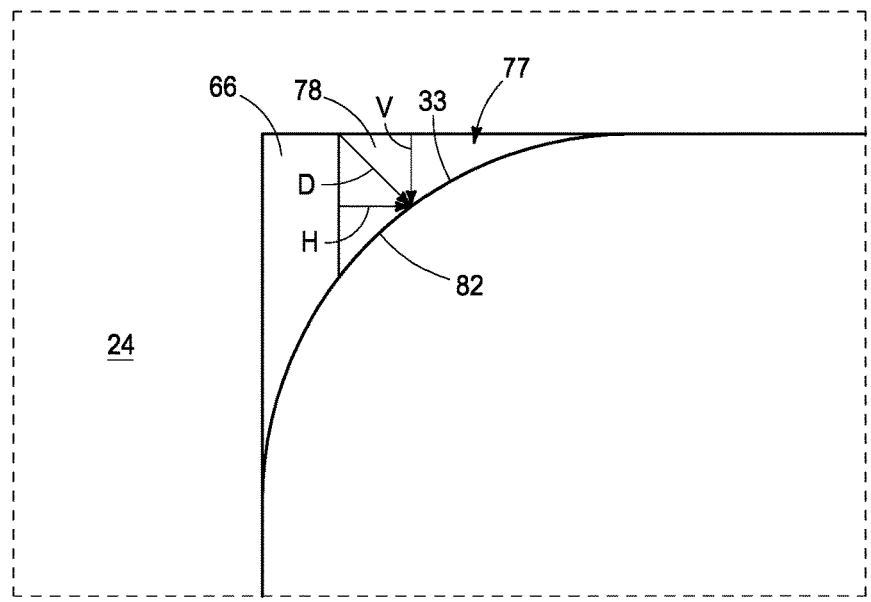
Figure 22:
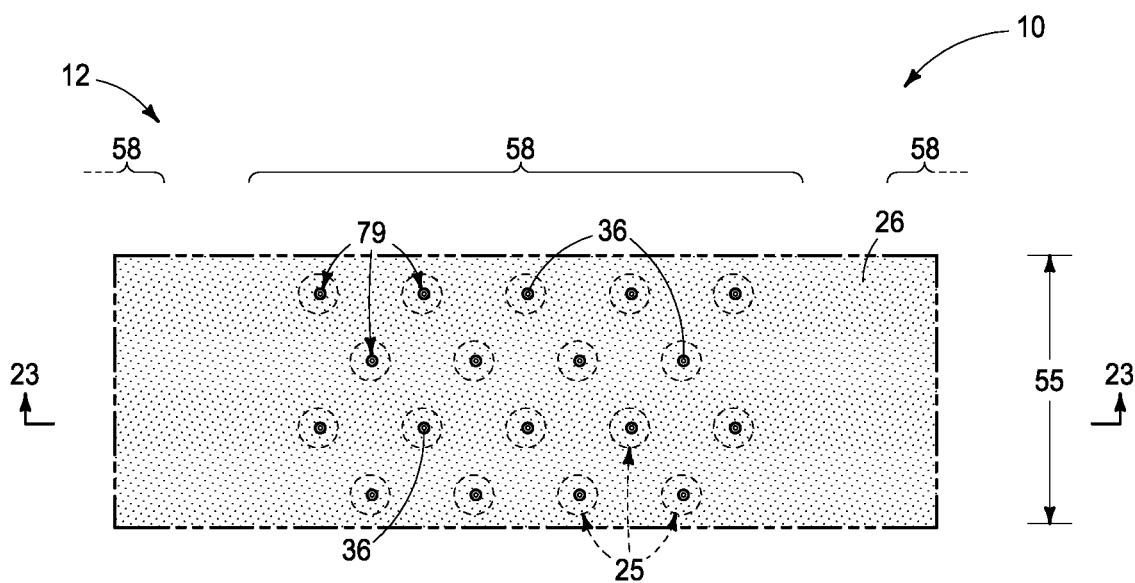
Figure 23:
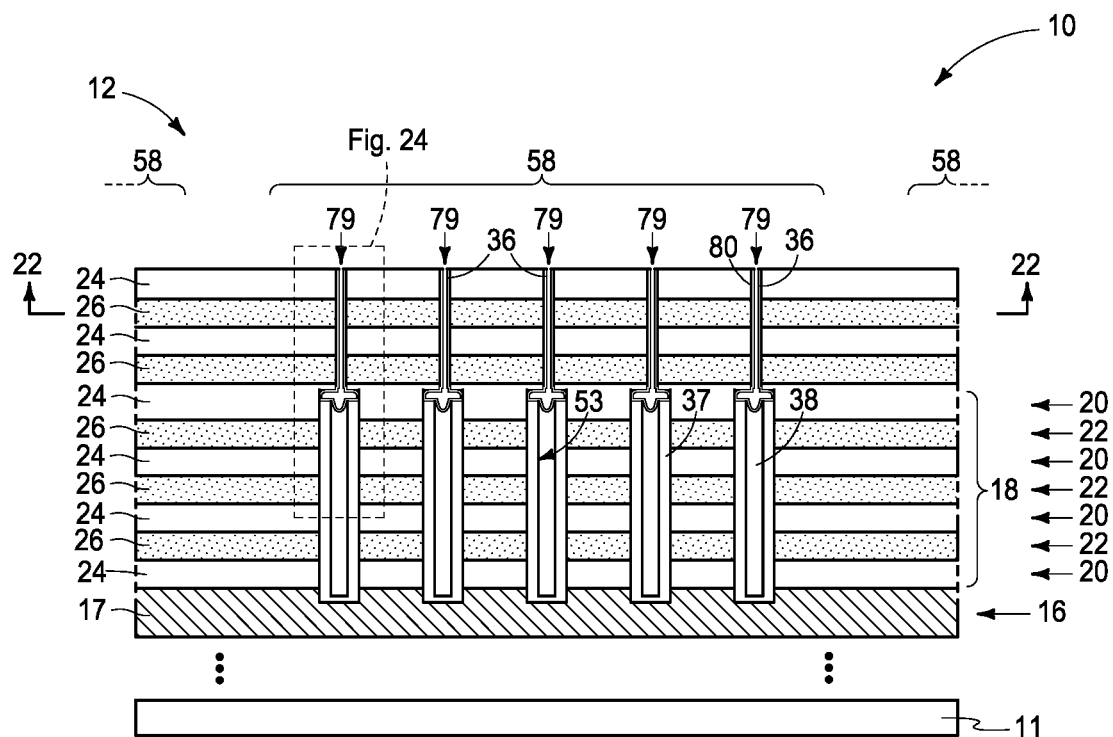
Figure 24:
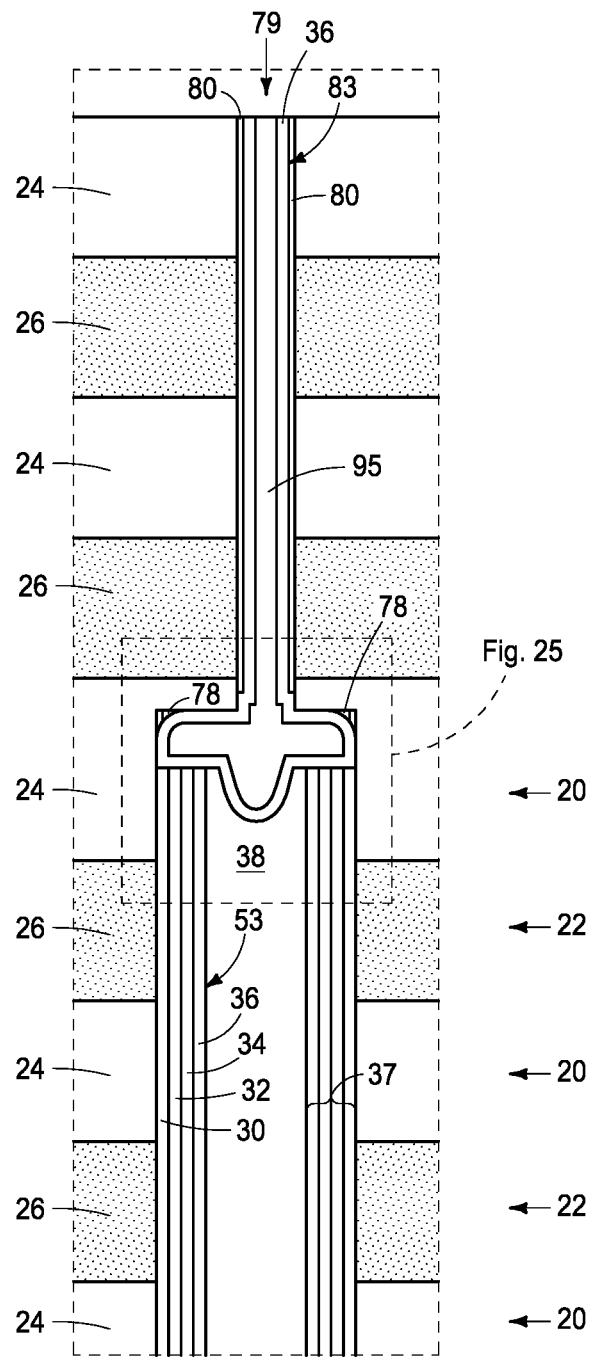
Figure 25:
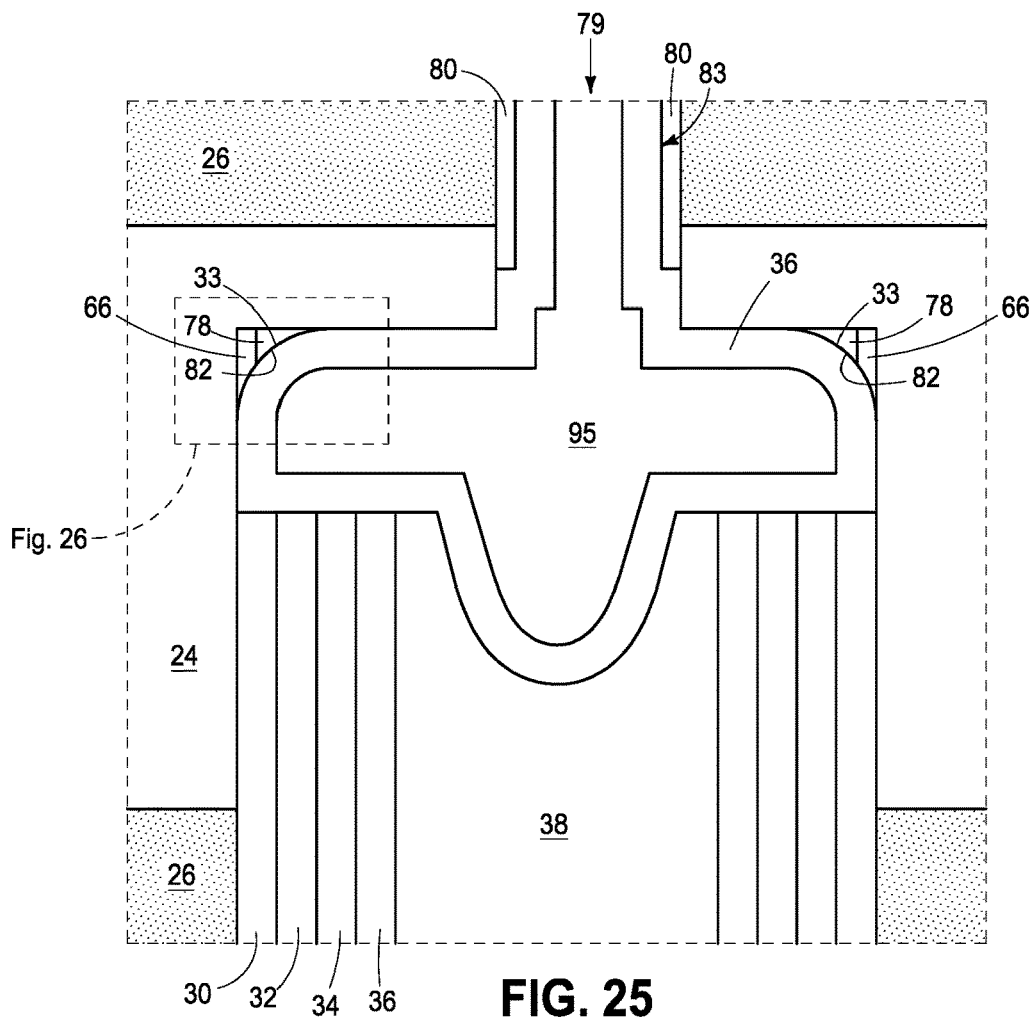
Figure 26:
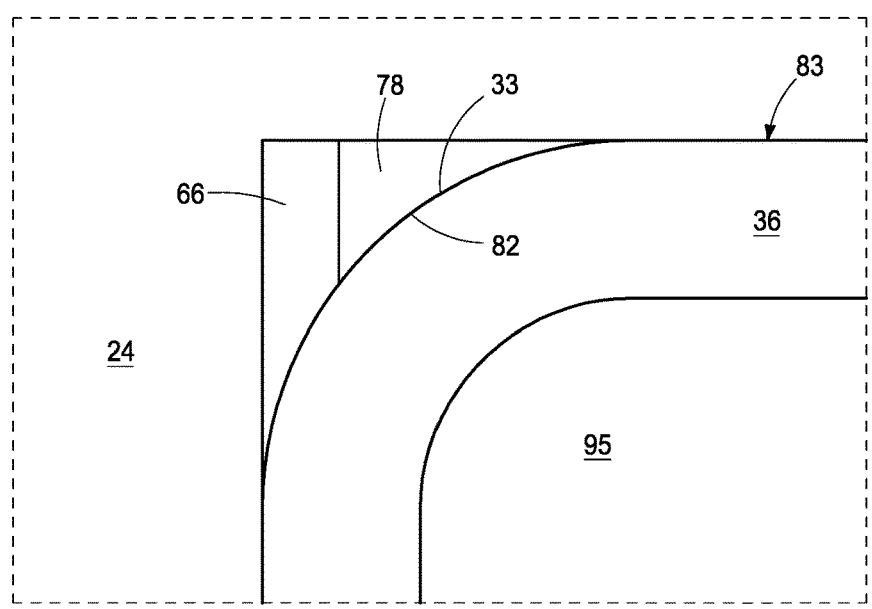

FIG. 17 shows example subsequent etch-back of gate insulator 80.

FIGS. 18-21 show example subsequent removing (e.g., by isotropic etching) of remaining volume of sacrificial plugs 67 (not shown), for example initially using TMAH to etch away polysilicon of inner portion 71 (not shown) and polysilicon of outer portion 70 (not shown), followed by using $H_3PO_4$ to etch silicon nitride 66. Some silicon nitride 66 may remain, for example as shown. Optional silicon nitride 66 may be used where outer portion 70, inner portion 71, and channel material 36 of lower channel-material strings 53 each comprise polysilicon to preclude etching of channel material 36 when etching away portions 70 and 71. Regardless, in one embodiment, sacrificial material 68 comprises insulating material (e.g., 66) of different composition from that of insulator material 78 and some of such insulating material remains laterally-outside of insulator material 78 in a finished-circuitry construction. In one such embodiment, insulator material 78 comprises silicon dioxide and insulating material 66 comprises silicon nitride.

Referring to FIGS. 22-26, channel material 36 of upper channel-material strings 83 has been formed below and against (e.g., directly against) lower surfaces 82 of insulator material 78 and that directly couples with channel material 36 of lower channel-material strings 53. In one embodiment, channel material 36 of upper channel-material strings 83 is formed directly against tops of channel material 36 of lower channel-material strings 53. The channel material of the top and bottom channel-material strings need not be of the same composition relative one another. An insulator material 95 (e.g., silicon dioxide) may fill remaining volume of upper-channel openings 79.

Figure 27:
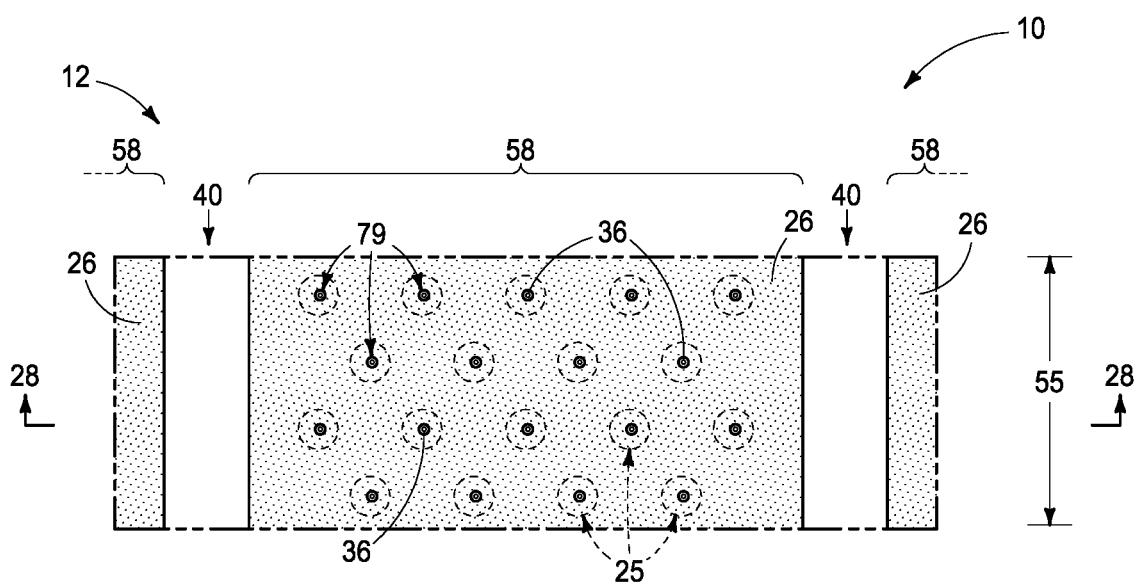
Figure 28:
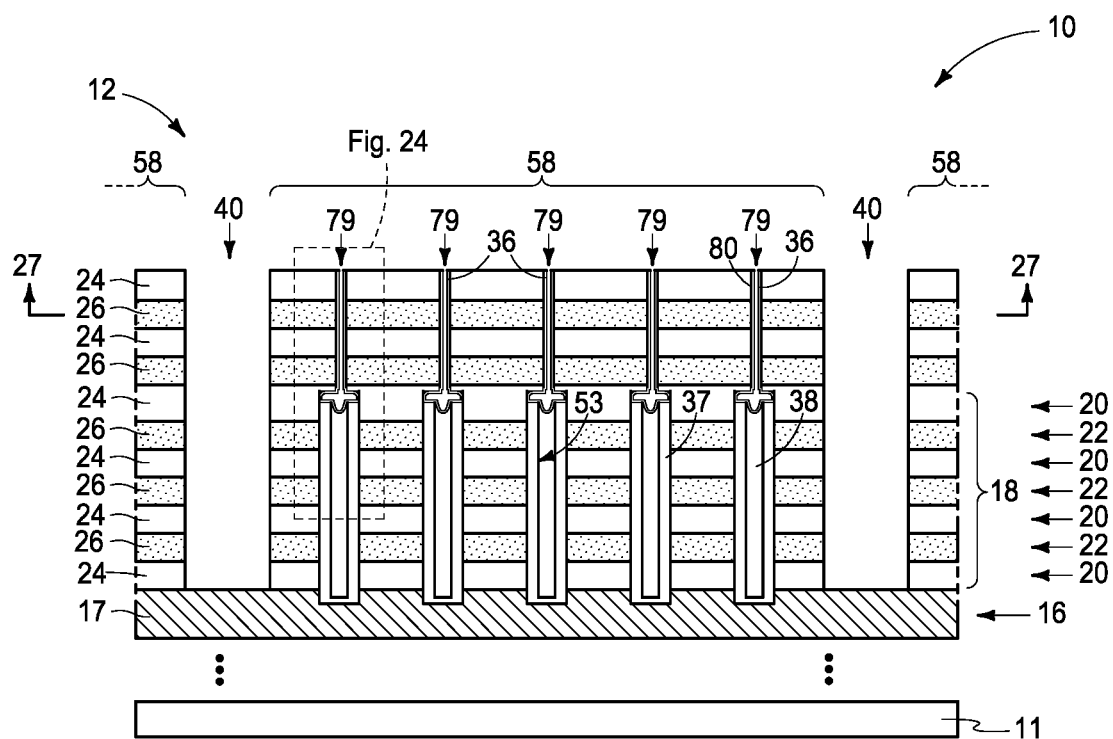
Figure 29:
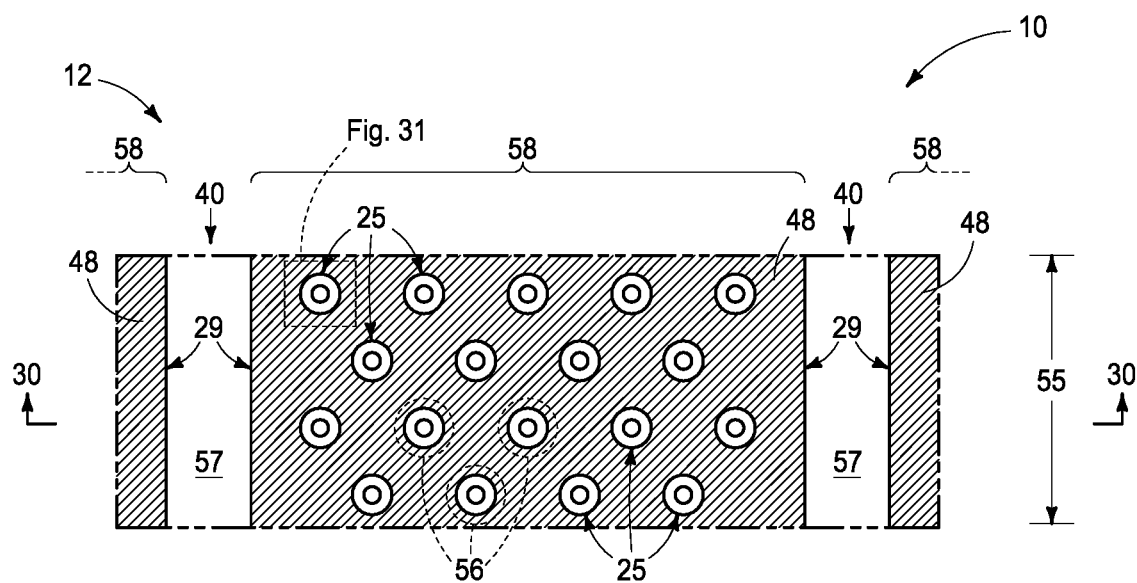
Figure 30:
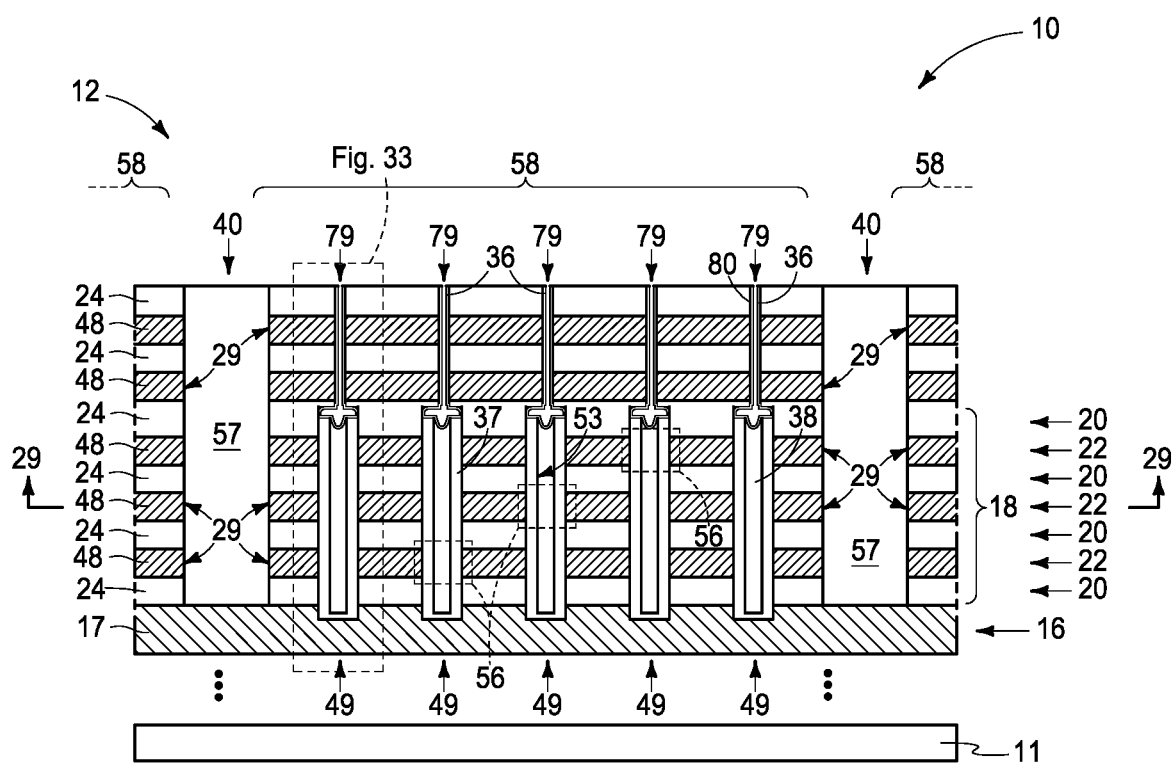
Figure 31:
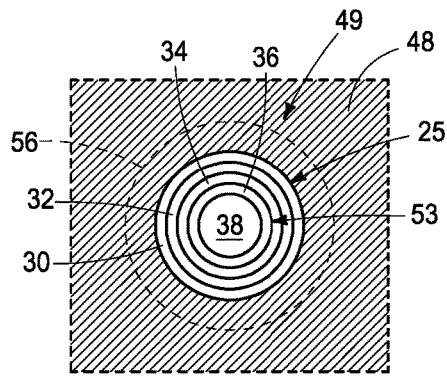
Figure 32:
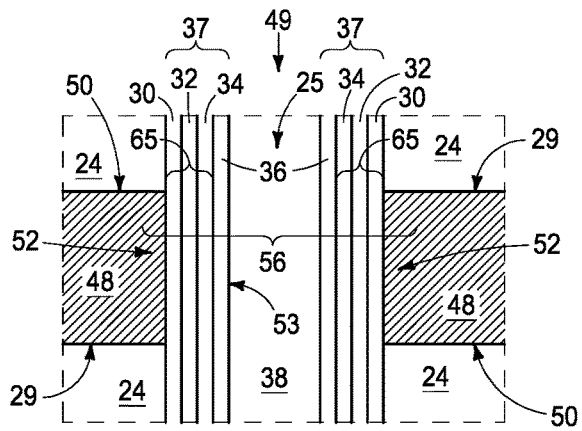
Figure 33:
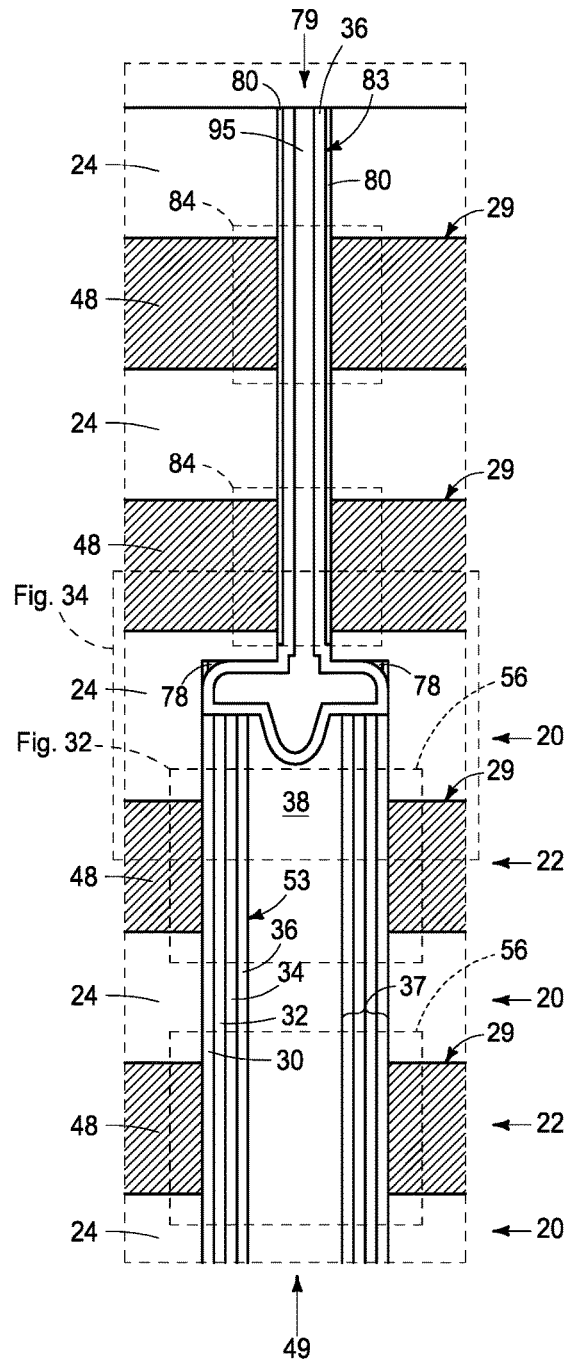
Figure 34:
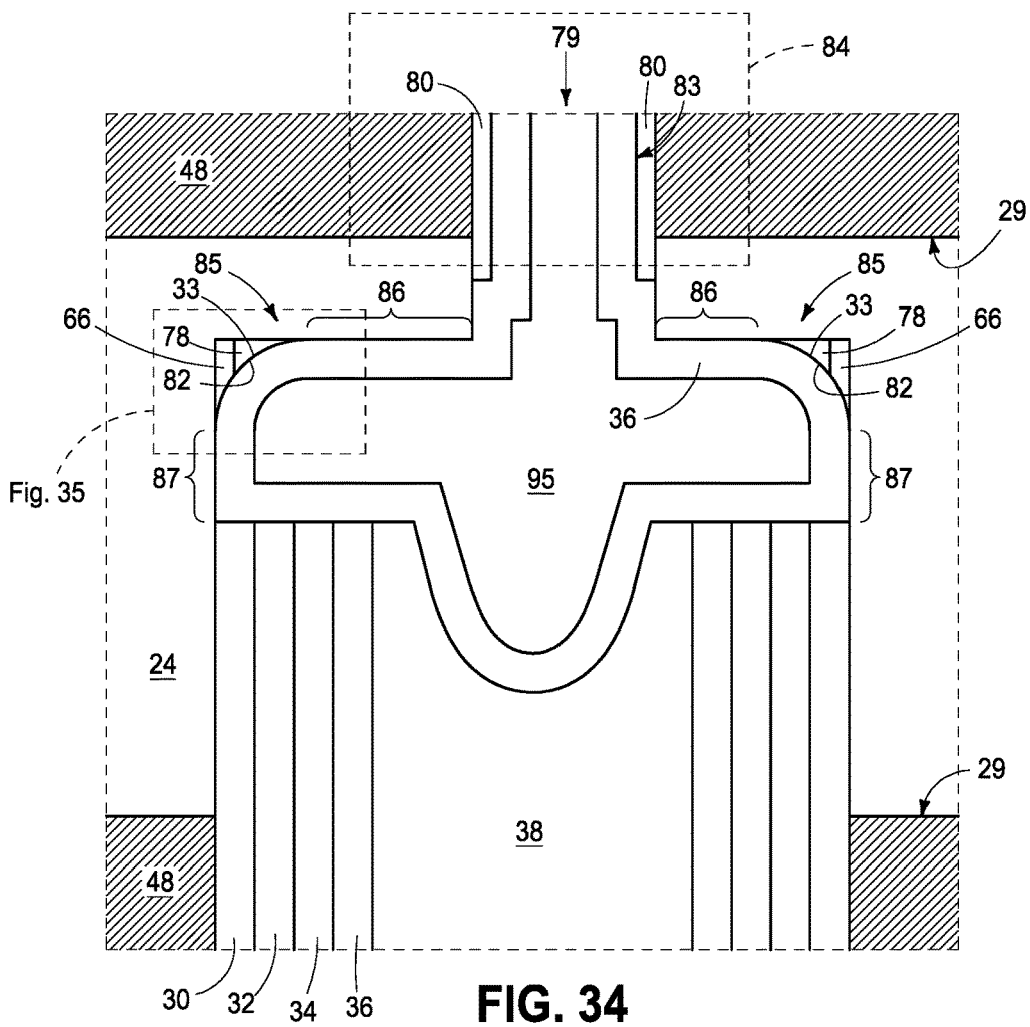
Figure 35:
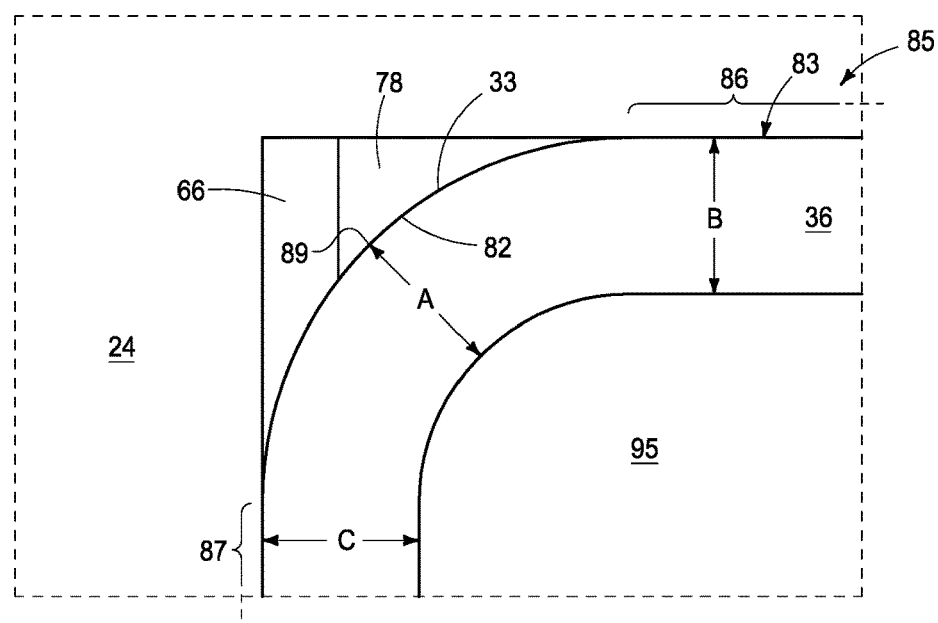

Referring to FIGS. 27 and 28, horizontally-elongated trenches 40 have been formed (e.g., by anisotropic etching) between immediately-laterally-adjacent memory-block regions 58. Trenches 40 will typically be wider than channel openings 25 (e.g., 3 to 10 times wider). Trenches 40 may have respective bottoms that are directly against conductor material 17 (e.g., atop or within) of conductor tier 16 (as shown) or may have respective bottoms that are above conductor material 17 of conductor tier 16 (not shown). Trenches 40 may taper laterally inward and/or outward in vertical cross-section (not shown).

Referring to FIGS. 29-35, material 26 (not shown) of first tiers 22 has been removed, for example by being isotropically etched away through trenches 40 ideally selectively relative to the other exposed materials (e.g., using liquid or vapor $H_3PO_4$ as a primary etchant where material 26 is silicon nitride and other materials comprise one or more oxides or polysilicon). Material 26 (not shown) in conductive tiers 22 in the example embodiment is sacrificial and has been replaced with conducting material 48, and which has thereafter been removed from trenches 40, thus forming individual conductive lines 29 (e.g., wordlines in stack 18) and elevationally-extending strings 49 of individual transistors and/or memory cells 56 in stack 18.

A thin insulative liner (e.g., $Al_2O_3$ and not shown) may be formed before forming conducting material 48. Approximate locations of transistors and/or memory cells 56 are indicated with a bracket in some figures and some with dashed outlines in some figures, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36. In one embodiment and as shown with respect to the example "gate-last" processing, conducting material 48 of conductive tiers 22 is formed after forming channel openings 25 and/or trenches 40. Alternately, the conducting material of the conductive tiers may be formed before forming channel openings 25 and/or trenches 40 (not shown), for example with respect to "gate-first" processing.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Intervening material 57 has been formed in trenches 40 and thereby laterally-between and longitudinally-along immediately-laterally-adjacent memory blocks 58. Intervening material 57 may provide lateral electrical isolation (insulation) between immediately-laterally-adjacent memory blocks. Such may include one or more of insulative, semiconductive, and conducting materials and, regardless, may facilitate conductive tiers 22 from shorting relative one another in a finished circuitry construction. Example insulative materials are one or more of $SiO_2$, $Si_3N_4$, and $Al_2O_3$. Intervening material 57 may include through array vias (not shown).

In one embodiment and as shown, lower channel-material strings 53 comprise strings 49 of memory cells 56 in a finished-circuitry construction and upper channel-material strings 83 comprise select gate transistors 84 in the finished-circuitry construction (e.g., such select gate transistors being select gate drains; e.g., comprising a portion of a conductive line 29 as a gate, a portion of gate insulator 80, and a portion of channel material 36 of an upper channel-material string 83). Individual of upper channel-material strings 83 comprise a corner region 85 having horizontal and vertical converging segments 86 and 87, respectively. Channel material 36 of individual upper channel-material strings 83 in corner region 85 of individual upper channel-material strings 83 has a maximum 45-degree thickness A taken from an outer apex 89 of corner region 85 of 0.8 to 1.3 times (in one embodiment 0.9 to 1.25 times) a greater of maximum vertical thickness B of horizontal segment 86 and maximum horizontal thickness C of vertical segment 87. In one embodiment, maximum 45-degree thickness C is no more than 1.25 times the greater of maximum vertical thickness B and maximum horizontal thickness C, in one such embodiment no more than 1.15 times greater, and in one such embodiment no more than 1.10 times greater.

In one embodiment, maximum 45-degree thickness A is at least as great as the greater of maximum vertical thickness B and maximum horizontal thickness C. In one embodiment, maximum 45-degree thickness A is equal to the greater of maximum vertical thickness B and maximum horizontal thickness C. In one embodiment, maximum vertical thickness B and maximum horizontal thickness C are the same. In one embodiment, insulator material (e.g., 78 and/or 66) is diagonally-outward of outer apex 89, with such insulator material comprising silicon nitride (e.g., 66) and silicon dioxide (e.g., 78) that are directly against one another and channel material 36 of upper channel-material string 83 that is in corner region 85.

Any other attribute(s) or aspect(s) as shown and/or described herein with respect to other embodiments may be used in the embodiments shown and described with reference to the above embodiments.

Prior constructions have dimension A being at least 1.414 times the greater of the maximum of dimensions B and C. Such wider dimensions A can result in lower conductivity through channel-material in such corner regions inherently due to such being wider and due to greater adverse electric fields being created in apexes of such corner regions.

Alternate embodiment constructions may result from method embodiments described above, or otherwise.

Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, a memory array comprising strings (e.g., 49) of memory cells (e.g., 56) comprises a stack (e.g., 18) comprising vertically-alternating insulative tiers (e.g., 20) and conductive tiers (e.g., 22). The strings of memory cells comprise lower channel-material strings (e.g., 53) that extend through the insulative tiers and the conductive tiers. Select gate transistors (e.g., 84) are directly above the stack. Individual of the select gate transistors comprise an upper channel-material string (e.g., 83) that is above individual of the lower channel-material strings and are directly electrically coupled thereto. The upper channel-material string comprising a corner region (e.g., 85) having horizontal and vertical converging segments (e.g., 86 and 87, respectively). Channel material (e.g., 36) of the upper channel-material string in the corner region has a maximum 45-degree thickness (e.g., A) taken from an outer apex (e.g., 89) of the corner region that is 0.8 to 1.3 times a greater of maximum vertical thickness (e.g., B) of the horizontal segment and maximum horizontal thickness (e.g., C) of the vertical segment. Any other attribute(s) or aspect(s) as shown and/or described herein with respect to other embodiments may be used.

In one embodiment, a memory array comprising strings (e.g., 49) of memory cells (e.g., 56) comprises a stack (e.g., 18) comprising vertically-alternating insulative tiers (e.g., 20) and conductive tiers (e.g., 22). The strings of memory cells comprise lower channel-material strings (e.g., 53) that extend through the insulative tiers and the conductive tiers. Select gate transistors (e.g., 84) are directly above the stack. Individual of the select gate transistors comprise an upper channel-material string (e.g., 83) that is above individual of the lower channel-material strings and are directly electrically coupled thereto. The upper channel-material string comprising laterally-opposing corner regions (e.g., 85) individually having horizontal and vertical converging segments (e.g., 86 and 87, respectively). Channel material (e.g., 36) of the upper channel-material string in individual of the corner regions has a maximum 45-degree thickness (e.g., A) taken from an outer apex (e.g., 89) of the individual corner regions that is 0.8 to 1.3 times a greater of maximum vertical thickness (e.g., B) of its horizontal segment and maximum horizontal thickness (e.g., C) of its vertical segment. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be conductive metal material and/or conductively-doped semiconductive/semiconductor/semiconducting material. "Metal material" is any one or combination of an elemental metal, any mixture or alloy of two or more elemental metals, and any one or more metallic compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming a memory array comprising strings of memory cells comprises forming a stack comprising vertically-alternating different-composition first tiers and second tiers. The stack comprises lower channel-material strings extending through the first tiers and the second tiers. A sacrificial plug comprises sacrificial material directly above individual of the lower channel-material strings. The sacrificial material is removed from laterally-opposing corner regions of the sacrificial plug in a greater amount diagonally than orthogonally relative to a sidewall of individual of the corner regions and than orthogonally relative to a top of the individual corner regions. Insulator material is formed in void spaces left from the removing. After forming the insulator material, remaining volume of the sacrificial plug is removed. Channel material of upper channel-material strings is formed below and against lower surfaces of the insulator material and that directly couples to channel material of the lower channel-material strings.

In some embodiments, a memory array comprising strings of memory cells comprises a stack comprising vertically-alternating insulative tiers and conductive tiers. Strings of memory cells comprise lower channel-material strings that extend through the insulative tiers and the conductive tiers. Select gate transistors are directly above the stack. Individual of the select gate transistors comprise an upper channel-material string that is above individual of the lower channel-material strings and directly electrically coupled thereto. The upper channel-material string comprises a corner region having horizontal and vertical converging segments. Channel material of the upper channel-material string in the corner region has a maximum 45-degree thickness taken from an outer apex of the corner region that is 0.8 to 1.3 times a greater of maximum vertical thickness of the horizontal segment and maximum horizontal thickness of the vertical segment.

In some embodiments, a memory array comprising strings of memory cells comprises a stack comprising vertically-alternating insulative tiers and conductive tiers. Strings of memory cells comprise lower channel-material strings that extend through the insulative tiers and the conductive tiers. Select gate transistors are directly above the stack. Individual of the select gate transistors comprise an upper channel-material string that is above individual of the lower channel-material strings and directly electrically coupled thereto. The upper channel-material string comprises laterally-opposing corner regions individually having horizontal and vertical converging segments. Channel material of the upper channel-material string in individual of the corner regions has a maximum 45-degree thickness taken from an outer apex of the individual corner regions that is 0.8 to 1.3 times a greater of maximum vertical thickness of its horizontal segment and maximum horizontal thickness of its vertical segment.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming a memory array comprising strings of memory cells, comprising:
    forming a stack comprising vertically-alternating different-composition first tiers and second tiers, the stack comprising lower channel-material strings extending through the first tiers and the second tiers, a sacrificial plug comprising a sacrificial material directly above of individual ones of the lower channel-material strings;
    removing the sacrificial material from laterally-opposing corner regions of the sacrificial plug in a greater amount diagonally along 45 degrees than orthogonally along 90 degrees relative to a sidewall of individual ones of the corner regions and in a greater amount than orthogonally vertical relative to a top of the individual ones of the corner regions;
    forming an insulator material in void spaces left from the removing;
    after forming the insulator material, removing remaining volume of the sacrificial plug; and
    forming a channel material of upper channel-material strings below and against lower surfaces of the insulator material and that directly couples to channel material of the lower channel-material strings.

2. The method of claim 1 wherein the removing of the sacrificial material from the laterally-opposing corner regions comprises etching.

3. The method of claim 2 wherein the etching is isotropic.

4. The method of claim 1 wherein the sacrificial material comprises silicon nitride and polysilicon.

5. The method of claim 4 wherein the silicon nitride is laterally-outside of the polysilicon, the polysilicon comprising a laterally-outer portion and a laterally-inner portion, the laterally-outer portion comprising a greater quantity of a dopant therein as compared to quantity of the dopant, if any, in the laterally-inner portion.

6. The method of claim 1 wherein the sacrificial material comprises an insulating material of different composition from that of the insulator material, some of the insulating material remaining laterally-outside of the insulator material in a finished-circuitry construction.

7. The method of claim 6 wherein the insulator material comprises silicon dioxide and the insulating material comprises silicon nitride.

8. The method of claim 1 wherein the channel material of the upper channel-material strings is formed directly against the lower surfaces of the insulator material.

9. The method of claim 1 comprising forming the channel material of the upper channel-material strings directly against tops of the channel material of the lower channel-material strings.

10. The method of claim 1 wherein the sacrificial material comprises doped semiconductive material, a dopant of the doped semiconductive material facilitating the removing of the greater amount diagonally along 45° than orthogonally along 90° relative to a sidewall of the individual ones of the corner regions and in the greater amount than orthogonally vertical relative to the top of the individual ones of the corner regions.

11. The method of claim 10 wherein a laterally-outer portion of the sacrificial material comprises greater quantity of the dopant than quantity of the dopant, if any, in a laterally-inner portion of the sacrificial material.

12. The method of claim 11 wherein the laterally-outer portion comprises a laterally-outermost part and a laterally-innermost part each of which comprises the dopant, the laterally-outermost part of the laterally-outer portion comprising greater quantity of the dopant than the laterally-innermost part of the laterally-outer portion.

13. The method of claim 12 wherein the laterally-outer part and the laterally-inner part comprise polysilicon, the dopant comprises phosphorus, and the removing of the sacrificial material from the laterally-opposing corner regions comprises etching.

14. The method of claim 13 wherein the sacrificial material comprises silicon nitride laterally-outward of the laterally-outer part, some of the silicon nitride remaining laterally-outside of the insulator material in a finished-circuitry construction.

15. The method of claim 1 wherein, the lower channel-material strings comprise strings of memory cells in a finished-circuitry construction and the upper channel-material strings comprise select gate transistors in the finished-circuitry construction; and
    individual ones of the upper channel-material strings comprise a corner region having horizontal and vertical converging segments, channel material of the individual ones of the upper channel-material strings in the corner region of the individual ones of the upper channel-material strings having a maximum 45-degree thickness taken from an outer apex of the corner region of 0.8 to 1.3 times a greater of a maximum vertical thickness of the horizontal segment and a maximum horizontal thickness of the vertical segment.

16. The method of claim 15 wherein the maximum 45-degree thickness is at least as great as the greater of the maximum vertical thickness of the horizontal segment and the maximum horizontal thickness of the vertical segment.

17. The method of claim 15 wherein the maximum 45-degree thickness is equal to the greater of the maximum vertical thickness of the horizontal segment and the maximum horizontal thickness of the vertical segment.

* * * * *